United States Patent
Yoon et al.

(10) Patent No.: US 8,089,379 B2
(45) Date of Patent: Jan. 3, 2012

(54) VARIABLE LENGTH DECODING APPARATUS AND METHOD

(75) Inventors: Ki Wook Yoon, Seoul (KR); Venkata Krishna Prasad Arava, Gyeonggi-do (KR); Ki Young Choi, Seoul (KR); Man Hwee Jo, Seoul (KR); Hyouk Joong Lee, Seoul (KR)

(73) Assignees: Core Logic, Inc., Seoul (KR); SNU R&DB Foundation, Seoul (KR)

( * ) Notice: Subject to any disclaimer, the term of this patent is extended or adjusted under 35 U.S.C. 154(b) by 223 days.

(21) Appl. No.: 12/635,558

(22) Filed: Dec. 10, 2009

(65) Prior Publication Data
US 2010/0149005 A1    Jun. 17, 2010

Related U.S. Application Data

(60) Provisional application No. 61/121,538, filed on Dec. 10, 2008.

(51) Int. Cl.
*H03M 7/40* (2006.01)

(52) U.S. Cl. .......................................... 341/67; 341/65

(58) Field of Classification Search ................ 341/67, 341/59, 65, 63, 50
See application file for complete search history.

(56) References Cited

U.S. PATENT DOCUMENTS
5,973,627 A * 10/1999 Bakhmutsky .................. 341/67
* cited by examiner

*Primary Examiner* — Joseph Lauture
(74) *Attorney, Agent, or Firm* — The Nath Law Group; Joshua B. Goldberg

(57) ABSTRACT

Techniques, apparatus and systems are described for performing variable length decoding. In one aspect, a variable length decoding apparatus includes a first computation unit to determine whether a symbol corresponding to an input data is included in an upper group or a lower group of a variable length code tree. Responsive to the determination, when the symbol corresponding to the input data is included in the lower group, the first computation unit detects look-up table information corresponding to a subgroup that includes the symbol corresponding to the input data within the lower group that includes multiple subgroups. The variable length decoding apparatus includes a second computation unit to detect the symbol corresponding to the input data by searching a look-up table corresponding to the look-up table information when the look-up table information is received from the first computation unit.

27 Claims, 15 Drawing Sheets

| Address | Symbol | Control Bit | Code length |
|---------|--------|-------------|-------------|
| 0 0 | c | 0 | 4(=3+2-1) |
| 0 1 | c | 0 | 4(=3+2-1) |
| 1 0 | Absent | 1 | - |
| 1 1 | e | 0 | 5(=3+2) |

FIG. 6

VARIABLE LENGTH DECODING APPARATUS AND METHOD

CROSS-REFERENCE TO RELATED APPLICATIONS

This application claims benefit of U.S. Provisional Patent Application No. 61/121,538, filed Dec. 10, 2008. The disclosure of the prior application is considered part of (and is incorporated by reference in) the disclosure of this application.

BACKGROUND

The present disclosure relates to a variable length decoding apparatus and method. The described apparatus, systems and techniques can be used to rapidly decode an input stream coded in a variable length coding format.

A video codec can be used to compress and encode a given video data and restore the encoded data back to its original video data. Examples of video codec standards include MPEG-1, MPEG-2, H.263, and H.264/MPEG-4. A video codec can provide lossy compression or lossless compression. Variable length coding is an example of the lossless compression scheme. Huffman coding is a type of variable length coding scheme that can be used to encode a given video data for digital transmission by shortening an average length of a code. To decode video data encoded using Huffman type variable length coding, a variable length decoding scheme is used.

A typical variable length decoder is implemented based on a bit-serial method or a look-up table method. A variable length decoder implemented based on the bit-serial method may not require much cost of memory, but the processing time can be too long. A variable length decoder implemented based on the look-up table method can have a fast processing time, but the cost for memory can be high.

SUMMARY

Techniques, apparatus and systems are described to provide variable length decoding that can minimize the cost for memory and circuit areas while guaranteeing a fast processing speed.

In one aspect, a variable length decoding apparatus is provided. The variable length decoding apparatus includes a first computation unit for determining whether a symbol corresponding to an input data is included in an upper group or a lower group of a variable length code tree. When the symbol corresponding to the input data is determined to be included in the lower group, the first computation unit can detect look-up table information corresponding to a subgroup that includes the symbol within the lower group that includes multiple subgroups. A second computation unit is operable to detect the symbol by searching a look-up table corresponding to the look-up table information when the look-up table information is received from the first computation unit. The first computation unit can directly detect the symbol when the symbol corresponding to the input data is determined to be included in the upper group.

Implementations can optionally include one or more of the following features. The first computation unit can include multiple comparison logics for comparing at least one bit of the input data and a specific code, and when the at least one bit of the input data is identical with the specific code, outputting any one of the symbol and the look-up table information corresponding to the subgroup that includes the symbol. The plurality of comparison logics can operate in parallel.

The first computation unit can include a symbol comparison unit to compare at least one bit of the input data and a code value of a symbol included in the upper group, and a prefix comparison unit for comparing the at least one bit of the input data and a prefix of a subgroup of the lower group.

The look-up table information can include an ID of a lookup table corresponding to the subgroup, an address value on which the look-up table corresponding to the subgroup can be found or both the ID and the address value. Each of the subgroups can be a tree in which a difference in a highest level between symbols is a specific value or less.

The variable length decoding apparatus may further include an input buffer unit for storing an input stream and a shifter unit for selecting the input data of M bits from the input stream stored in the input buffer unit. M can include an integer of 1 or more bits. The first computation unit, the second computation unit or both the first computation unit and the second computation units may use the input data selected by the shifter unit.

The first computation unit, the second computation unit or both the first computation unit and the second computation unit can send an actual code length value corresponding to the detected symbol to the shifter unit. The shifter unit can select a next input data based on the received actual code length value.

The shifter unit can shift by the actual code length value from a first bit of the previously selected input data in order to select the next input data and select the input data of the M bits, wherein M is an integer of 1 or greater.

The variable length decoding apparatus may further include a memory unit for storing a plurality of look-up tables corresponding to the plurality of respective subgroups included in the lower group.

The look-up table can include a code value corresponding to a leaf within the subgroup, a value of a symbol corresponding to the leaf within the subgroup, a control value indicating whether a valid symbol exists in the leaf within the subgroup, and an actual code length value corresponding to the symbol. The second computation unit can determine that the input data has an error when a control value of the detected symbol indicates that the symbol is invalid.

The variable length decoding apparatus may further include a variable length code tree split unit for splitting the variable length code tree into the upper group and the lower group and splitting the lower group into the plurality of subgroups and a look-up table storage unit for configuring a plurality of look-up tables corresponding to the plurality of respective subgroups and storing the plurality of configured look-up tables in a memory unit.

The variable length code tree split unit can use any one of a quantum-inspired evolution algorithm (QEA) method and an empirical method in order to split the variable length code tree. The variable length code tree split unit can split the variable length code tree such that a value, obtained by multiplying an area cost for constructing the first computation unit, the second computation unit, and the memory unit, and a square of a delay time for detecting a symbol together, is minimized.

When each of the subgroups is not a perfect tree, the look-up table storage unit can transform the subgroup into a perfect tree by adding at least one virtual node and configure a look-up table corresponding to the transformed subgroup.

In another aspect, a variable length decoding apparatus is provided. The variable length decoding apparatus includes a first computation unit for comparing at least one bit of input data and a specific code and detecting a symbol, corresponding to the input data, or look-up table information corresponding to a subgroup including the symbol according to whether the symbol is included in an upper level or a lower level of a variable length code tree. The variable length decoding apparatus includes a second computation unit for detecting the symbol by searching a look-up table corresponding to the look-up table information when the look-up table information is received from the first computation unit.

In yet another aspect, a variable length decoding method is provided. The variable length decoding method includes determining whether a symbol corresponding to an input data is included in an upper group or a lower group of a variable length code tree. When the symbol is determined to be included in the lower group, look-up table information corresponding to a subgroup including the symbol within the lower group is detected. In addition, the symbol is detected by searching a look-up table corresponding to the detected look-up table information.

Implementations can optionally include one or more of the following features. The variable length decoding method may further include, when the symbol is determined to be included in the upper group of the variable length code tree, detecting a symbol included in the upper group.

The variable length decoding method may further include storing an input stream in a buffer and selecting the input data of M bits from the input stream stored in the buffer. M is an integer of at least one.

The variable length decoding method may further comprise feeding back an actual code length value corresponding to the detected symbol and selecting a next input data based on the feedback actual code length value.

The look-up table may include a code value corresponding to a leaf within the subgroup, a value of a symbol corresponding to the leaf within the subgroup, a control value indicating whether a valid symbol exists in the leaf node within the subgroup, and an actual code length value corresponding to the symbol.

The variable length decoding method may further include determining that the input data has an error when a control value of the detected symbol indicates that the symbol is invalid.

The variable length decoding method may further include splitting the variable length code tree into the upper group and the lower group, splitting the lower group into a plurality of subgroups, configuring a plurality of look-up tables corresponding to the plurality of respective subgroups, and storing the plurality of configured look-up tables in a memory unit.

The variable length decoding method may further include detecting a tree split form in which a value obtained by multiplying an area cost for constructing computation units and the memory unit and a square of a delay time for detecting a symbol together is minimized.

Determining whether a symbol corresponding to an input data is included in an upper group or a lower group of a variable length code tree may include comparing at least one bit of the input data and a specific code by operating a plurality of comparison logics in parallel.

The described techniques, apparatus and systems can provide one or more of the following advantages. For example, the throughput and efficiency of a variable length decoding scheme described here can be increased to reduce the overall cost associated with a video decoder. The throughput and efficiency can be increased by designing an efficient variable length decoder that can reduce the computation time and the cost for memory and circuit areas.

BRIEF DESCRIPTION OF THE DRAWINGS

FIG. 6 is a diagram illustrating a look-up table stored in a memory unit by a look-up table storage unit in response to a first subgroup.

DETAILED DESCRIPTION

Techniques, apparatus and systems described herein can be used to efficiently decode an input stream coded in a variable length coding format.

Figure 1:
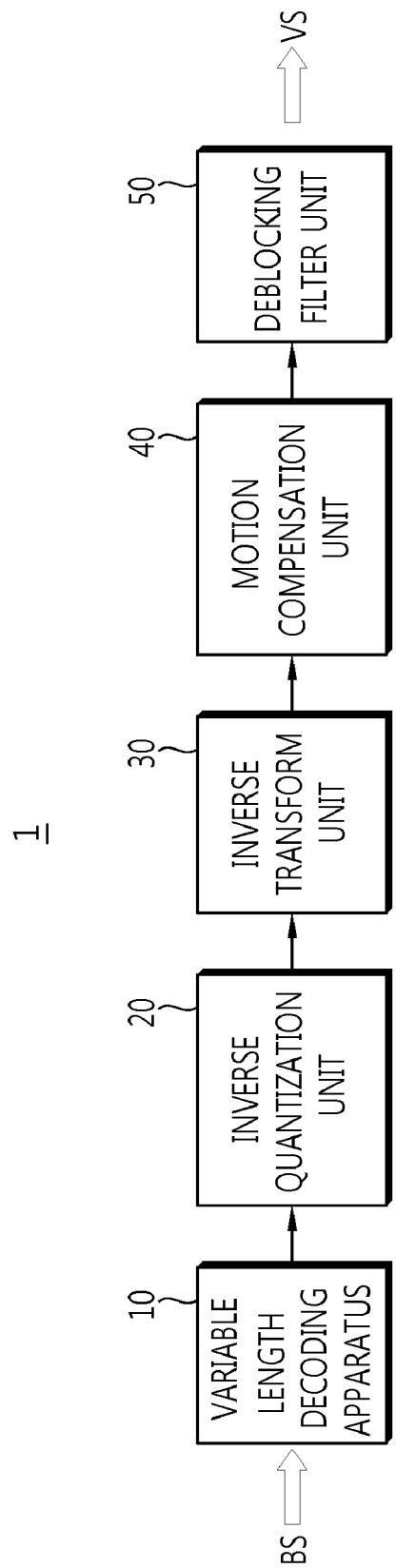
FIG. 1 is a block diagram showing a video decoder including a variable length decoding apparatus.

FIG. 1 is block diagram showing a video decoder including a variable length decoding apparatus. As shown in FIG. 1, the video decoder 1 can receive an input stream (e.g., an encoded video bit stream), decode the input stream, and then output a video stream. The video decoder 1 can include a variable length decoding apparatus 10, an inverse quantization unit 20, an inverse transform unit 30, a motion compensation unit 40, a deblocking filter unit 50, and so on.

The variable length decoding apparatus 10 can receive an input stream and perform lossless decoding. The inverse quantization unit 20 can restore an actual discrete cosine transform (DCT) coefficient value by inversely quantizing data outputted from the variable length decoding apparatus 10. The inverse transform unit 30 performs inverse-discrete cosine transform (I-DCT) for the data received from the inverse quantization unit 20. The motion compensation unit 40 can be connected to the output terminal of the inverse transform unit 30 to perform motion compensation. The output of the motion compensation unit 40 can be connected to the deblocking filter 50 for reducing the deterioration of the blocking picture quality of a macroblock boundary line.

Figure 2:
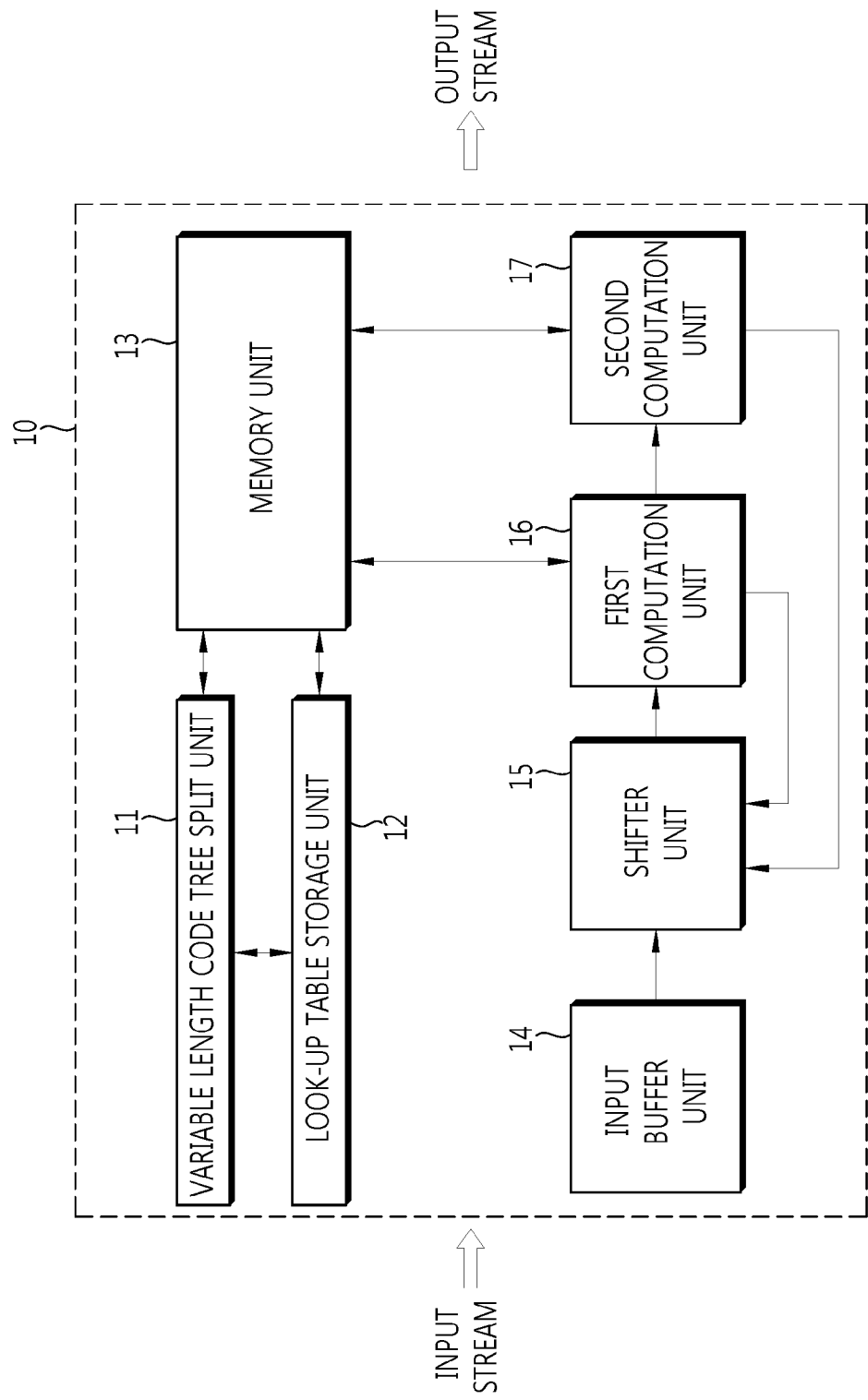
FIG. 2 is a block diagram showing a variable length decoding apparatus.

FIG. 2 is a block diagram showing a variable length decoding apparatus. As shown in FIG. 2, the variable length decoding apparatus 10 can include different components, such as a variable length code tree split unit 11, a look-up table storage unit 12, a memory unit 13, an input buffer unit 14, a shifter unit 15, a first computation unit 16, and a second computation unit 17. The components of the variable length decoding apparatus 10 are described below.

Variable Length Code Tree Split Unit 11

The variable length code tree split unit 11 can split a variable length code tree (e.g., a Hoffman tree) into multiple groups. For example, the variable length code tree split unit 11 can split a variable length code tree into an upper group and a lower group. Moreover, the variable length code tree split unit 11 can split the lower group into one or more subgroups.

Each of the subgroups can have a tree (or cluster) form including at least one symbol. In addition, the variable length code tree split unit 11 can split a lower group into one or more subgroups such that a difference in the highest level between symbols within each subgroup becomes a specific value or less.

Figure 3:
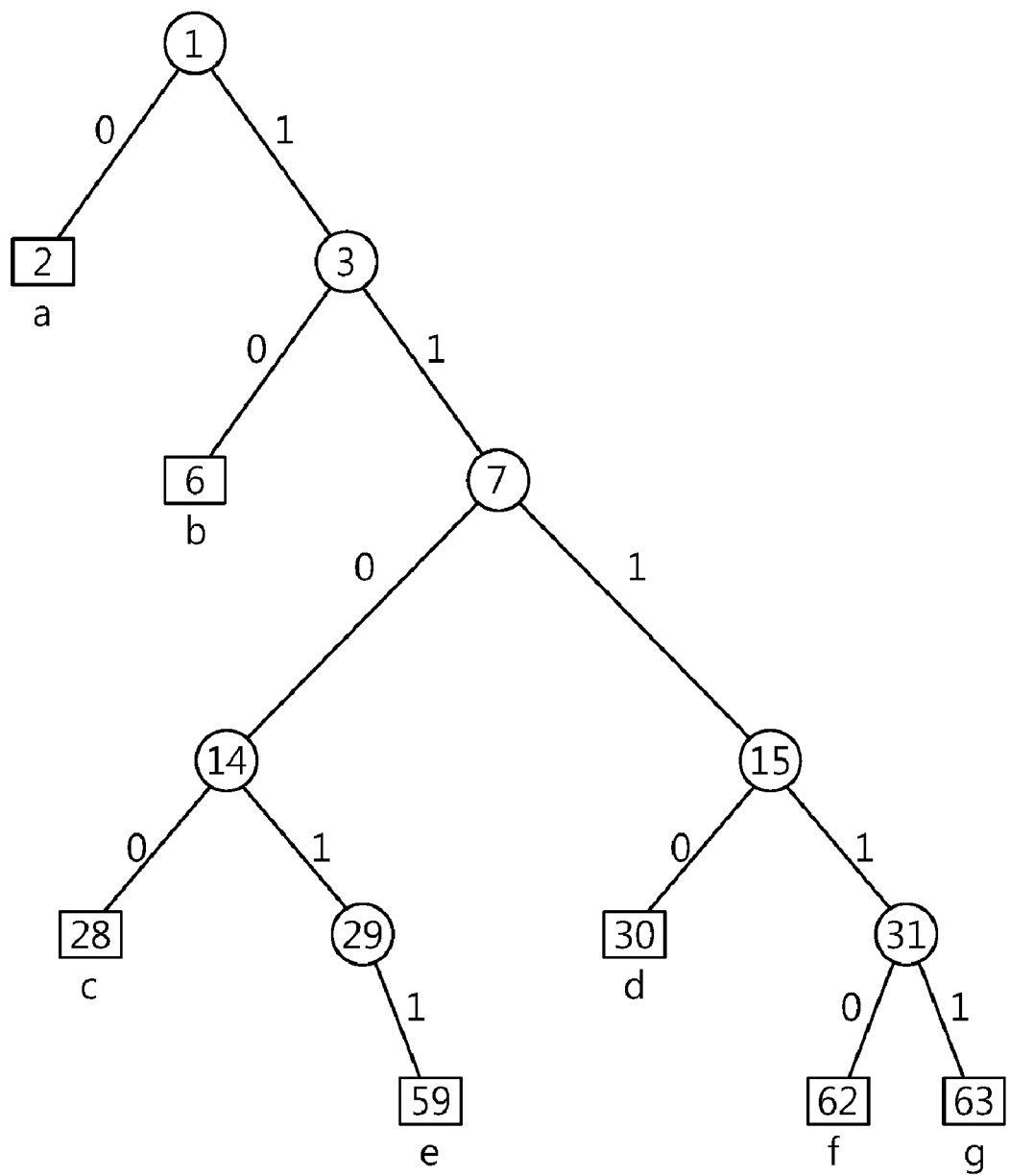
FIG. 3 is a diagram showing an example of a variable length code tree.

FIG. 3 is a diagram showing an example of a variable length code tree. The example shown in FIG. 3 is a single-side growing Huffman (SGH) type tree of five levels. Circles and quadrangles can be used to indicate different types of nodes of a variable length code tree. The nodes of the variable length code tree can include internal nodes and leaf nodes. The internal nodes, represented by circles, can be attached to another internal node, a leaf node or both. The leaf nodes of the variable length code tree, represented by quadrangles, are located at a terminal end of a tree and attached to a parent internal node. Each leaf node can be associated with a unique symbol. A letter (e.g., a, b, c, d, e, f or g) written below each leaf node indicates the value of the corresponding symbol associated with each leaf node.

The variable length code tree can be configured to perform a search starting from a root node based on an input bit. Starting from root node 1, an input bit '0' can be used to indicate following a left child node and an input bit '1' can be used to indicate following a right child node. For example, an input bit '0' at root node 1 indicates following the left child node 2, a leaf node associated with symbol, a. An input bit '1' at the root node 1 indicates following the right child node 3. In some implementations, input bit '0' can be used to indicate following the right child node, and input bit '1' can be used to indicate following the left child node.

In the variable length code tree of FIG. 3, the symbol 'a' of node 2 (e.g., a leaf node) is located in a first level and has a code length of '1' and a codeword of '0.' The symbol 'b' of leaf node 6 is located in a second level and has a code length of '2' and a codeword of '10.' The symbol 'c' of leaf node 28 is located in a fourth level and has a code length of '4' and a codeword of '1100.' The symbol 'd' of leaf node 30 is located in a fourth level and has a code length of '4' and a codeword of '1110.' The symbol 'e' of leaf node 59 is located in a fifth level and has a code length of '5' and a codeword of '11011.' The symbol 'f' of leaf node 62 is located in the fifth level and has a code length of '5' and a codeword of '11110.' The symbol 'g' of leaf node 63 is located in the fifth level and has a code length of '5' and a codeword of '11111.'

Figure 4:
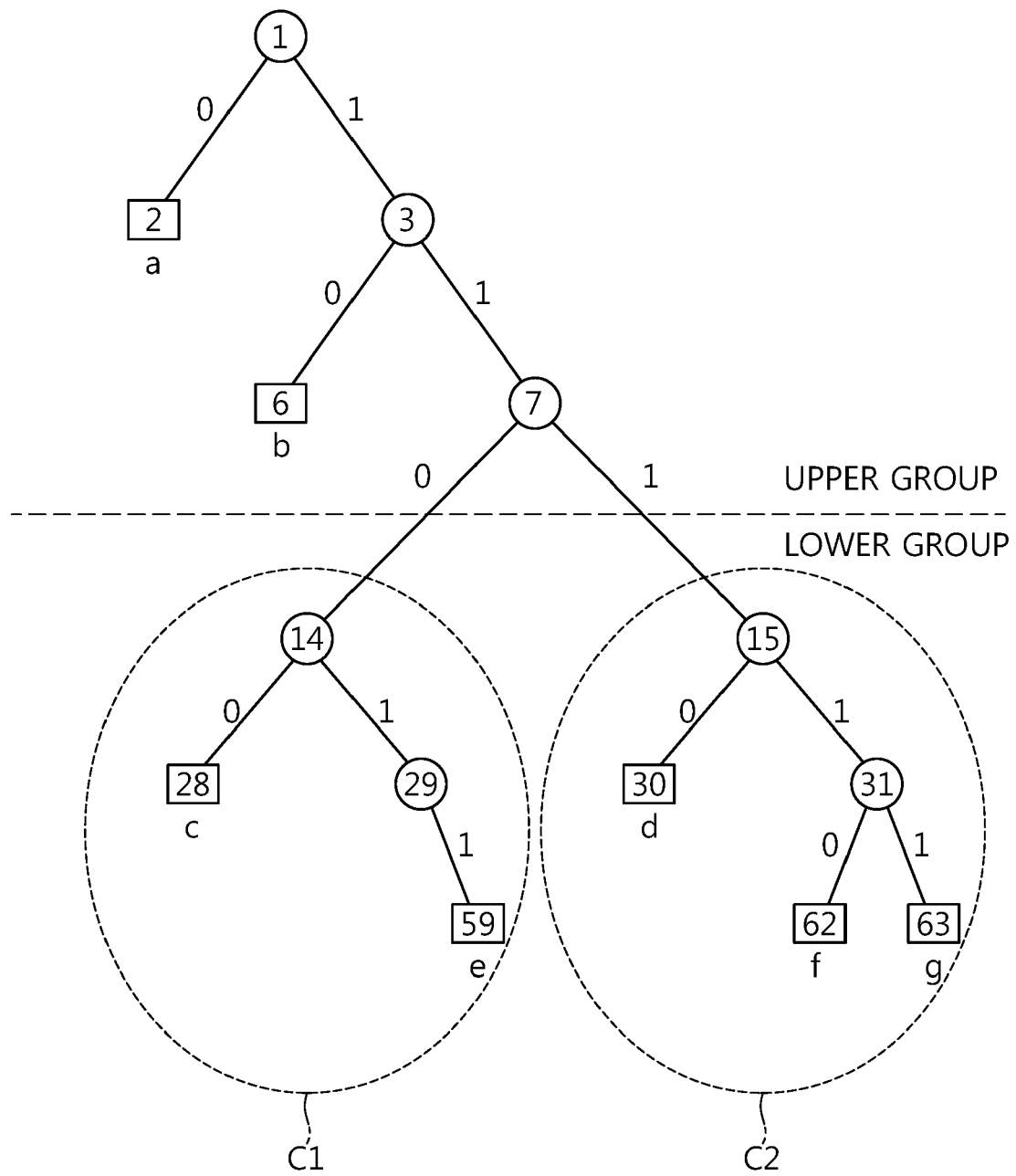
FIG. 4 is a diagram showing a variable length code tree split on a group basis by a variable length code tree split unit.

FIG. 4 is a diagram showing a variable length code tree split on a group basis by the variable length code tree split unit 11. As shown in FIG. 4, the variable length code tree split unit 11 can split a variable length code tree into an upper group and a lower group. The upper group can include symbol 'a' and 'b'.

The variable length code tree split unit 11 can split the lower group into multiple subgroups (e.g., a first subgroup C1 and a second subgroup C2) such that a difference in the highest level between symbols within each subgroup is a specific value or less (e.g., 1 level or less). For example, the first subgroup C1 includes symbols 'c' and 'e', and a difference in the highest level between the symbols (e.g., a difference in the level between symbol 'c' and symbol 'e') is 1 level. The second subgroup C2 includes symbols 'd', 'f', and 'g', and a difference in the highest level between the symbols (e.g., a difference in the level between symbol 'd' and symbol 'f' or between symbol 'd' and symbol 'g') is 1 level.

Look-Up Table Storage Unit 12

The look-up table storage unit 12 can configure a look-up table corresponding to each subgroup spilt by the variable length code tree split unit 11 and store the configured look-up tables in the memory unit 13. To configure the look-up tables corresponding to the subgroups, the look-up table storage unit 12 can transform a given subgroup into a perfect tree form by adding a virtual node to the tree of the given subgroup. The look-up table storage unit 12 can configure a look-up table corresponding to the transformed subgroup. Responsive to the second computation unit 17 searching for a symbol, the searched for symbol can be detected in the added virtual node of the transformed subgroup. The look-up table corresponding to the transformed subgroup can include information (e.g., an actual code length value, a control value, etc.) of a node associated with an actual symbol corresponding to the symbol detected in the virtual node.

Figure 5:
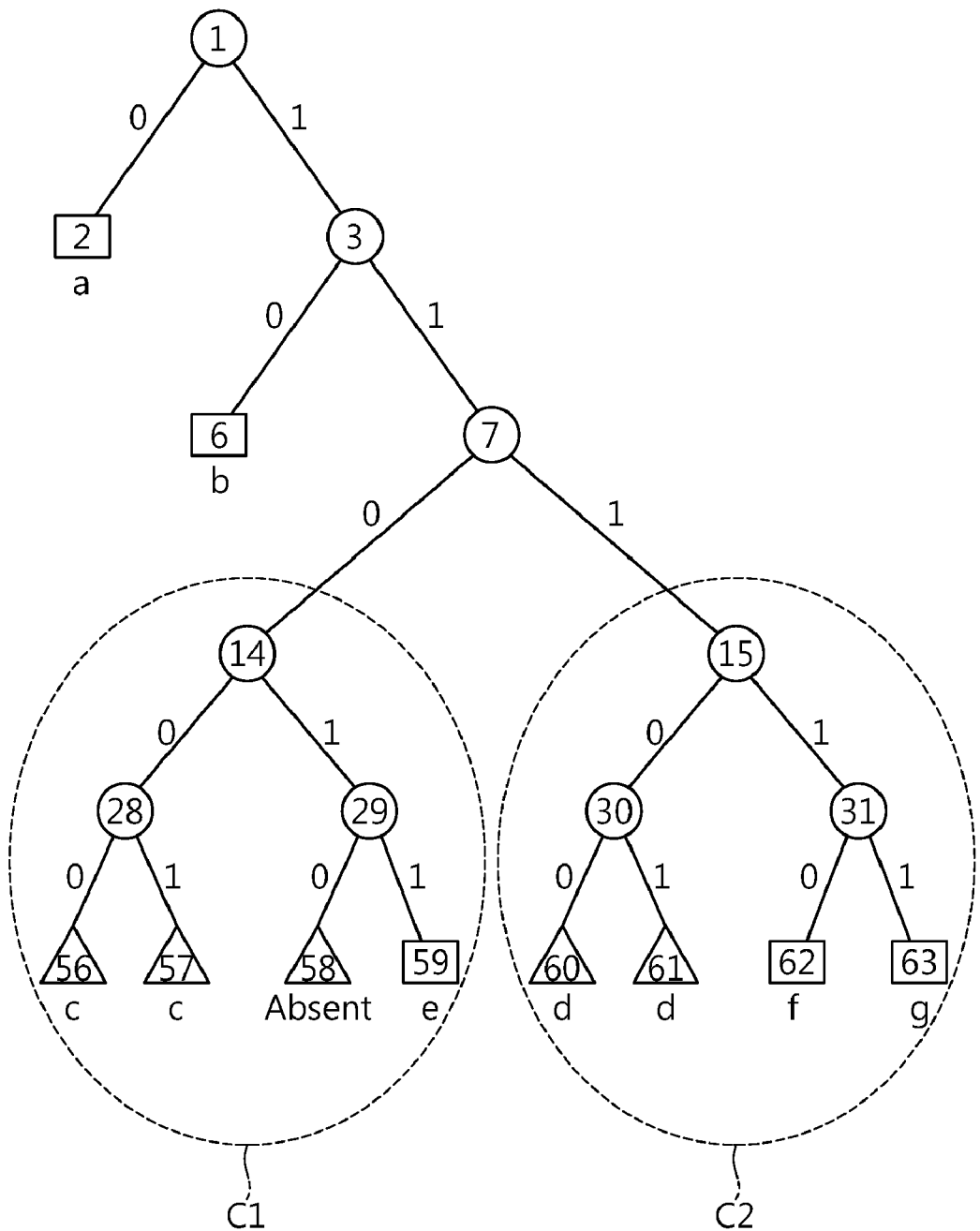
FIG. 5 is a diagram showing an example in which each subgroup is transformed into a perfect tree form in order to store a look-up table corresponding to each subgroup shown in FIG. 4.

FIG. 5 is a diagram showing an example in which each subgroup is transformed into a perfect tree form in order to store a look-up table corresponding to each subgroup shown in FIG. 4. In FIG. 5, each triangle denotes a virtual node added to a tree during a transformation into the perfect tree.

In the example shown in FIG. 5, virtual nodes 56 and 57, the child nodes of the node 28) are added to the first subgroup C1, resulting in a new virtual leaf node. The virtual nodes 56 and 57 succeed to be associated with symbol 'c,' the symbol value of the parent node 28, which was previously a leaf node 28. Because the twp virtual nodes 56 and 57 replaces node 28 as the leaf nodes, the net increase is one leaf node. Furthermore, a virtual node 58 is added as a child node of node 29. In this case, although the virtual node 58 is a leaf node, a symbol value is not assigned. The first subgroup, C1, can be transformed into a perfect tree form by adding the virtual nodes as described above.

According to the same concept, virtual nodes 60 and 61, the child nodes of node 30 can be added to the second subgroup, C2. Because the virtual nodes 60 and 61 are leaves, virtual nodes 60 and 61 can succeed to be assigned symbol, 'd,' the symbol value of the parent node 30.

FIG. 6 is a diagram illustrating a look-up table stored in a memory unit by a look-up table storage unit for the transformed first subgroup C1. As shown in FIG. 6, the look-up table includes a code value, a symbol value, a control value, and an actual code length value corresponding to each leaf node within a subgroup. The column labeled, 'Address' shown in FIG. 6 can refer to a code value corresponding to each leaf node within the first subgroup C1. For example, code values 00, 01, 10, and 11 correspond to leaf nodes 56, 57, 58 and 59 respectively.

However, to find the first subgroup C1 during a search for a symbol, a search route starting from the root node 1 to node 3, node 7, and node 14 is traversed. Accordingly, a prefix, such as 110 can be added to the code values of the leaf nodes belonging to the first subgroup C1. For example, the code values of nodes 56, 57, 58, and 59 can become 11000, 11001, 11010, and 11011 respectively.

The prefix can be added as an address value for finding a subgroup. For example, the prefix 110 can be used as an address value for finding the first subgroup C1. Thus, the code values of the leaf nodes within the first subgroup C1 can be expressed as the added prefix or address value (e.g., 110)+the code value within group. As described above, a given subgroup belonging to a lower group has a unique address value, and the code value of a leaf node belonging to the given subgroup can be expressed as an address value of the given subgroup to which the corresponding leaf node belongs+a code value within a group (e.g., lower group).

The column labeled 'Symbol' shown in FIG. 6 can refer to the value of a symbol corresponding to a leaf node included within the first subgroup C1. For example, the virtual node 56 and the virtual node 57 are leaves succeeding to the symbol of the node 28. Accordingly, the value of the symbol corresponding to the leaves 56 and 57 is symbol 'c'. The virtual node 58 has no symbol value (therefore, indicated by 'Absent'). In this case, the corresponding cell of a look-up table may be empty or specific information may be inserted into the cell. The symbol value of node 59 is shown as 'e'.

The column labeled 'Control bit' can refer to a control value indicating whether a valid symbol exists in the leaves included in the first subgroup C1. For example, because the virtual node 56, the virtual node 57, and the node 59 (e.g., the leaves) have respective valid symbols, the control value corresponding to the nodes can be set to a first value (e.g., '0' or '1'). However, the virtual node 58 does not have a valid symbol value. Accordingly, the control value corresponding to the virtual node 58 can be set to a second value (e.g., '1' or '0').

Responsive to a search for a symbol, the variable length decoding apparatus 10 can determine whether the input data is normal data by checking the control value of a leaf node detected according to the input data. For example, when the input data is '11010', a leaf detected according to the input data is the virtual node 58. However, a valid symbol for the virtual node 58 does not exist because the control value of the virtual node 58 is '1'. In this case, the variable length decoding apparatus 10 determines that error has occurred in '11010', the input data.

The column labeled 'Code length' can refer to an actual code length value corresponding to a symbol included in the first subgroup C1. That is, the actual code length value can refer to the actual code length of a symbol corresponding to each leaf node of the first subgroup C1 that has been transformed into the perfect tree form.

The code length of a given symbol corresponding to the leaf node of the first subgroup C1 may be different from the code length of an actual symbol. This may be because the symbols corresponding to the virtual nodes added in the process of transforming the first subgroup into the perfect tree form are actually a symbol corresponding to a parent node to which the virtual nodes belong.

For example, in the first subgroup C1, the symbol 'c' corresponding to the virtual node 56 has the code value of 11000, which represents a prefix or an address value 110 and a code value 00 within the group. Accordingly, a code length value of symbol 'c' corresponding to the virtual node 56 is 5. However, because symbol 'c' is the symbol corresponding to the original node 28, an actual code length value of symbol 'c' is 4 in which 1 has been subtracted from 5. In a similar way, a code length value of symbol 'c' corresponding to the virtual node 57 is 5, but an actual code length value of the symbol 'c' is 4.

In addition, a symbol 'e' corresponding to node 59 (e.g., the leaf node of the first subgroup C1) has a code value of 11011 in which a prefix or the address value 110 and the code value 11 within the group are added. Accordingly, a code length value of symbol 'e' corresponding to node 59 is 5. However, because the node 59 is not a virtual node, an actual code length value of the symbol 'e' remains 5.

That is, in the case where a given symbol within the first subgroup C1 corresponds to a leaf node rather than a virtual node, an actual code length value of the given symbol is a value in which a prefix or the length of an address value of the first subgroup C1 and the length of a code value within a group of the symbol are added. On the other hand, in the case where a symbol within the first subgroup C1 corresponds to a virtual node, an actual code length value of the symbol is a value in which a difference in the level between a node corresponding to an actual symbol and a virtual node (e.g., 1 in the case of the symbol 'c') has been subtracted from the sum of a prefix or the length of an address value of the first subgroup C1 and the length of a code value within a group of the symbol.

The look-up table storage unit 12 can store the look-up table generated as described above in the memory unit 13 using a look-up table ID and an address value (e.g., a prefix) of a corresponding group. Hereinafter, the address value of a corresponding group is referred to as a 'look-up table address value'. The look-up table address value can be used as information for finding a look-up table responsive to a search for a symbol using the second computation unit 17.

Memory Unit 13

The memory unit 13 can store a group-based look-up table generated by the look-up table storage unit 12. In this case, as described above, each look-up table can be stored in the memory unit 13 using a look-up table ID and a look-up table address value.

For example, in the example shown in FIG. 5, the memory unit 13 can store a first look-up table, corresponding to the first subgroup C1, using a look-up table ID and a look-up table address value of the first look-up table and can store a second look-up table, corresponding to the second subgroup C2, using a look-up table ID and a look-up table address value of the second look-up table.

Input Buffer Unit 14

The input buffer unit 14 can store an input stream. The input stream can refer to, for example, a variable-length coded bit stream received through a variable length coding apparatus (not shown). The input stream stored in the input buffer unit 14 can be selected by the shifter unit 15 in a unit of predetermined bits and then provided to the first computation unit 16, the second computation unit 17, etc.

Shifter Unit 15

The shifter unit 15 can select input data of previously stored specific bits (e.g., M bits, an integer of 1 or more) from the input stream stored in the input buffer unit 14. The selected input data is provided to the first computation unit 16 or the second computation unit 17. The shifter unit 15 can receive a code length value corresponding to a processed symbol from the first computation unit 16 or the second computation unit 17 and select next input data based on the received code length value.

For example, when M is 5, the shifter unit 15 can select input data of a total of 5 bits, ranging from a first bit to a fifth bit, from the input stream stored in the input buffer unit 14 and provide the selected input data to the first computation unit 16 or the second computation unit 17. Next, if a code length value (e.g., 3) corresponding to the processed symbol has been received from the first computation unit 16 or the second computation unit 17, the first bit to the third bit of the input data are decoded. Accordingly, the shifter unit 15 can select the next input data of a total of 5 bits, ranging from the fourth bit to an eighth bit, from the input stream and provide the selected input data to the first computation unit 16 or the second computation unit 17.

First Computation Unit 16

The first computation unit 16 can determine whether a given symbol corresponding to the input data selected by the shifter unit 15 has been included in an upper group or a lower group of a variable length code tree. If, as a result of the determination, the given symbol is determined to be included in the lower group, the first computation unit 16 detects the look-up table information corresponding to a subgroup including the given symbol. If, as a result of the determination, the given symbol is determined to be included in the upper group, the first computation unit 16 may directly detect the given symbol. The first computation unit 16 may be implemented using a hardware circuit or may be implemented in software or a combination.

Figure 7:
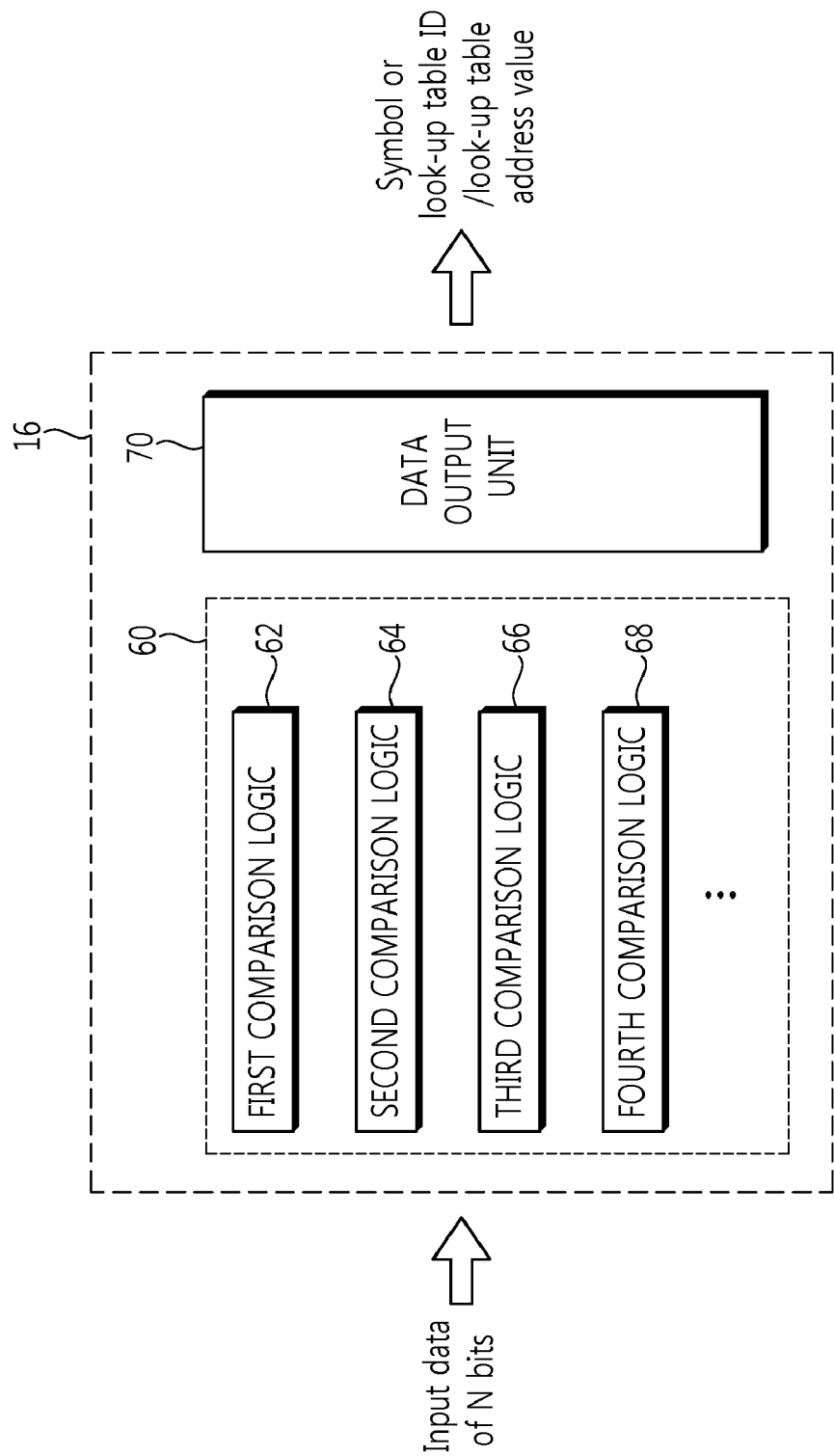
FIG. 7 is a block diagram showing a first computation unit.

FIG. 7 is a block diagram showing various components of a first computation unit 16. As shown in FIG. 7, the first computation unit 16 can include a comparison unit 60 and a data output unit 70. The comparison unit 60 can directly detect a given symbol by comparing the input data of M bits and a predetermined code or detecting the look-up table information corresponding to a subgroup to which the given symbol belongs.

The comparison unit 60 can include multiple comparison logics 62 to 68. Each of the comparison logics 62 to 68 can compare at least one bit of the input data and a specific code. If, as a result of the comparison, the at least one bit of the input data is identical to the specific code, the comparison logics 62-68 can provide output information. The output information can be a symbol or look-up table information corresponding to a subgroup to which a given symbol belongs. In this case, the look-up table information can include a look-up table ID, a look-up table address value, etc.

For example, if the first computation unit 16 is configured according to the examples shown in FIGS. 3 to 6, the comparison unit 60 of the first computation unit 16 can include the first comparison logic 62, the second comparison logic 64, the third comparison logic 66, and the fourth comparison logic 68. In this case, the first comparison logic 62 and the second comparison logic 64 are comparison logics for detecting symbols 'a' and 'b' belonging to the upper group. The third comparison logic 66 and the fourth comparison logic 68 are comparison logics for detecting a first look-up table corresponding to the first subgroup C1 and a second look-up table corresponding to the second subgroup C2.

The first comparison logic 62 can determine whether the most significant bit of the input data of M bits is '0' by comparing the input data and a specific code. For example, the first comparison logic 62 can include a logic for comparing the most significant bit of the input data of M bits and a code '0'. If the most significant bit of the input data is '0,' the first comparison logic 62 can provide the output information indicating that a given symbol corresponding to the current input data is symbol 'a'.

The second comparison logic 64 can determine whether the upper two bits of the input data of M bits is '10' (e.g., whether a first bit is 1 and a second bit is 0) by comparing the input data and a specific code. For example, the second comparison logic 64 can include a logic for comparing the upper two bits of the input data of M bits and a code '10'. If the first two bits of input data are 10, the second comparison logic 64 can provide the output information indicating that a given symbol corresponding to the current input data is symbol 'b'.

The third comparison logic 66 can determine whether the upper three bits of the input data of M bits are 110 (e.g., whether a first bit is 1, a second bit is 1, and a third bit is 0) by comparing the input data and a specific code. For example, the third comparison logic 66 can include a logic for comparing the upper three bits of the input data of M bits and a code '110'. If the upper three bits of the input data are 110, the third comparison logic 66 can output information (e.g., a look-up table ID and a look-up table address value) on which a look-up table corresponding to a first subgroup having the address value (e.g., a prefix) of 110 can be found.

The fourth comparison logic 68 can determine whether the upper three bits of the input data of M bits are 111 (e.g., whether a first bit is 1, a second bit is 1, and a third bit is 1) by comparing the input data and a specific code. For example, the fourth comparison logic 68 can include a logic for comparing the upper three bits of the input data of M bits and a code '111'. If the upper three bits of the input data are 111, the fourth comparison logic 68 can output information (e.g., a look-up table ID and a look-up table address value) on which a look-up table corresponding to a second subgroup having the address value of 111 can be found.

The first comparison logic 62 and the second comparison logic 64 are logics for finding the symbols of an upper group corresponding to the input data, and so can be collectively called a symbol comparison unit. The third comparison logic 66 and the fourth comparison logic 68 are logics for finding the subgroups of a lower group corresponding to input data, and so can be collectively called a prefix comparison unit.

The comparison logics 62 to 68 included in the comparison unit 60 can operate in parallel. For example, the operations of the comparison unit 60 for detecting symbols and detecting look-up table information can be performed in parallel using the comparison logics 62 to 68. Accordingly, the comparison unit 60 can rapidly perform processing for the input data within one cycle. Each of the comparison logics 62 to 68 can be configured using a hardware circuit for the purpose of rapid processing. In some implementations, the comparison logics 62 to 68 can be configured in software tangibly embodied on a computer readable medium.

When a given symbol is received from the comparison unit 60, the data output unit 70 of the first computation unit 16 can output the given symbol externally. Furthermore, when a given symbol is received from the comparison unit 60, the data output unit 70 can send a code length value of the given symbol to the shifter unit 15. In this case, the shifter unit 15 can select the next input data based on the code length value received from the data output unit 70.

When the look-up table information is received from the comparison unit 60, the data output unit 70 of the first computation unit 16 can send the look-up table information to the second computation unit 17. In this case, the second computation unit 17 can detect a symbol by searching a look-up table based on the look-up table information received from the first computation unit 16.

Second Computation Unit 17

When the look-up table information is received from the first computation unit 16, the second computation unit 17 can detect a given symbol corresponding to the input data by searching a look-up table based on the look-up table information. For example, the second computation unit 17 can detect a given symbol by searching a look-up table based on portions other than a prefix in the input data.

Furthermore, the second computation unit 17 can detect a symbol and then send an actual code length value of the corresponding symbol to the shifter unit 15. In this case, the shifter unit 15 can select the next input data based on the actual code length value received from the data output unit. The actual code length value, as described above, can refer to an actual length of a code corresponding to a symbol. This can be because, for example, if the length value of a code corresponding to a virtual node is sent to the shifter unit 15 when a detected symbol is a symbol corresponding to the virtual node, the next input data to be actually selected cannot be accurately selected. Accordingly, a code length value of a node actually corresponding to the detected symbol is sent to the shifter unit 15.

In response to a result of searching the look-up table based on the portions other than the prefix of the input data, a node having a control value corresponding to a second value (e.g., 1) is detected, the second computation unit 17 can output information indicating that error has occurred in the input data. As described above, if the control value is the second value, a valid symbol does not exist. Accordingly, the second computation unit 17 can output information indicating that error has occurred in the input data.

As described above, the second computation unit 17 detects symbols using a look-up table. Such detection of the symbols using the look-up table can be performed within one operation cycle. Accordingly, in the case where a symbol belongs to an upper group, the variable length decoding apparatus 10 according to the present invention can detect the symbol within one cycle through the first computation unit 16. In the case where a symbol belongs to a lower group, the variable length decoding apparatus 10 can detect the symbol within a total of 2 operation cycles by performing one operation cycle in the first computation unit 16 and one operation cycle in the second computation unit 17. Accordingly, a symbol can be rapidly detected.

Conventionally, in the case where a symbol is detected through the look-up table method using a look-up table corresponding to a variable length tree, the symbol can be rapidly detected, but the amount of information of the look-up table is excessively increased, thereby increasing the cost for a memory area. On the other hand, in the case where the bit-serial method is used, the cost for a memory area can be significantly reduced, but an arithmetic logic becomes complicated and the processing time becomes too long. However, the variable length decoding apparatus described herein is advantageous in that it enables rapid decoding processing and has relatively lower cost for a memory area and a circuit region.

Figure 8:
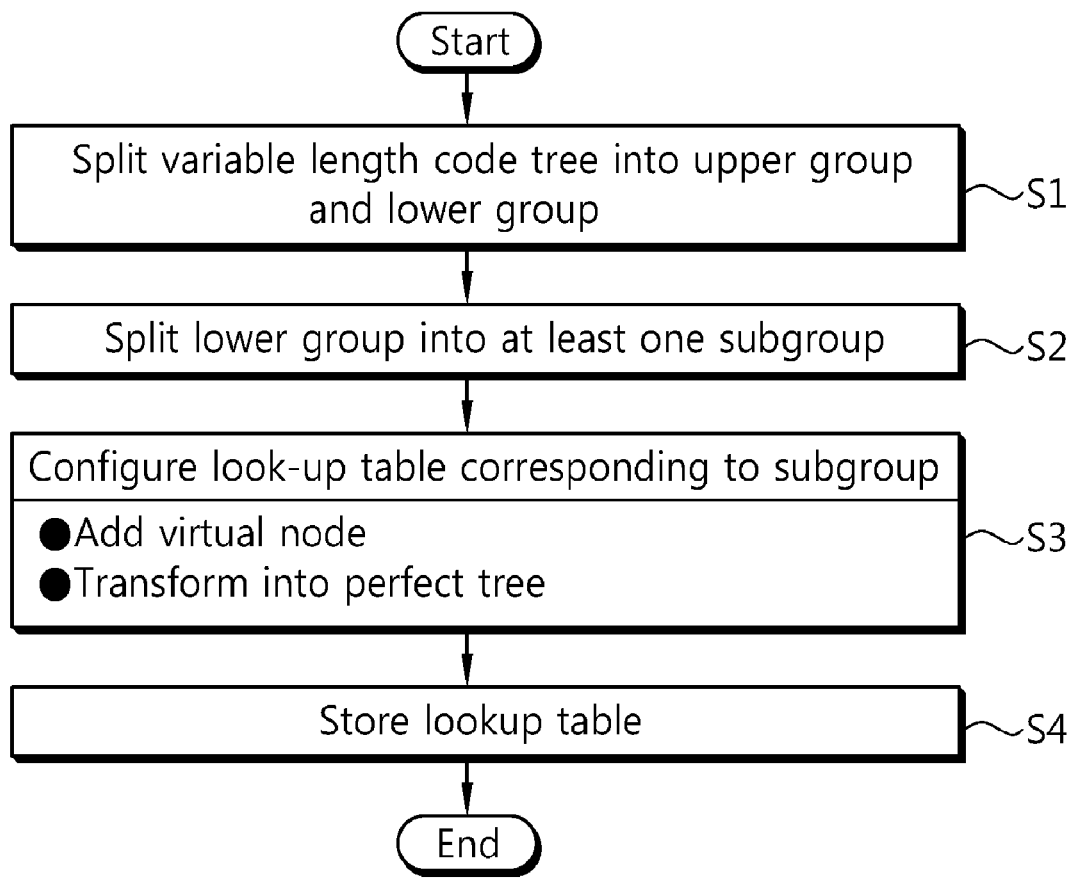
FIG. 8 is a flowchart illustrating a process of splitting a variable length code tree and storing a look-up table using a variable length decoding apparatus.

Hereinafter, a variable length decoding procedure based on the variable length decoding apparatus 10 is described further below. FIG. 8 is a flowchart illustrating a procedure of splitting a variable length code tree and storing a look-up table using the variable length decoding apparatus 10.

As shown in FIG. 8, the variable length decoding apparatus 10 first splits a predetermined variable length code tree into an upper group and a lower group (step: S1). The variable length decoding apparatus 10 splits the lower group into one or more subgroups (step: S2).

Each of the subgroups has a tree (or cluster) form having at least one symbol. Furthermore, a difference in the highest level between the symbols within the subgroup preferably is a specific value (e.g., 1) or less. That is, the variable length tree split unit 11 can split a lower group into one or more subgroups such that a difference in the highest level between symbols within each subgroup becomes a specific value or less.

Next, the variable length decoding apparatus 10 configures a look-up table corresponding to each of the subgroups (step: S3). To configure the look-up table corresponding to the subgroup, the variable length decoding apparatus 10 can transform the subgroup into a perfect tree form by adding virtual nodes to the subgroup of a tree form and configure a look-up table corresponding to the transformed subgroup.

The look-up table, as described above, can include a code value, a symbol value, a control value, and an actual code length value within a group corresponding to each leaf within the subgroup. If a symbol is detected in a virtual node upon search for the symbol, the variable length decoding apparatus 10 can recognize a node in which an actual symbol exists using the actual code length value. The variable length decoding apparatus 10 can also detect errors of input data based on the control value.

Next, the variable length decoding apparatus 10 can store the configured look-up table in specific storage means (e.g., the memory unit 13) (step: S4). The look-up table stored in the memory unit 13 can be associated with a look-up table ID and a look-up table address value.

Figure 9:
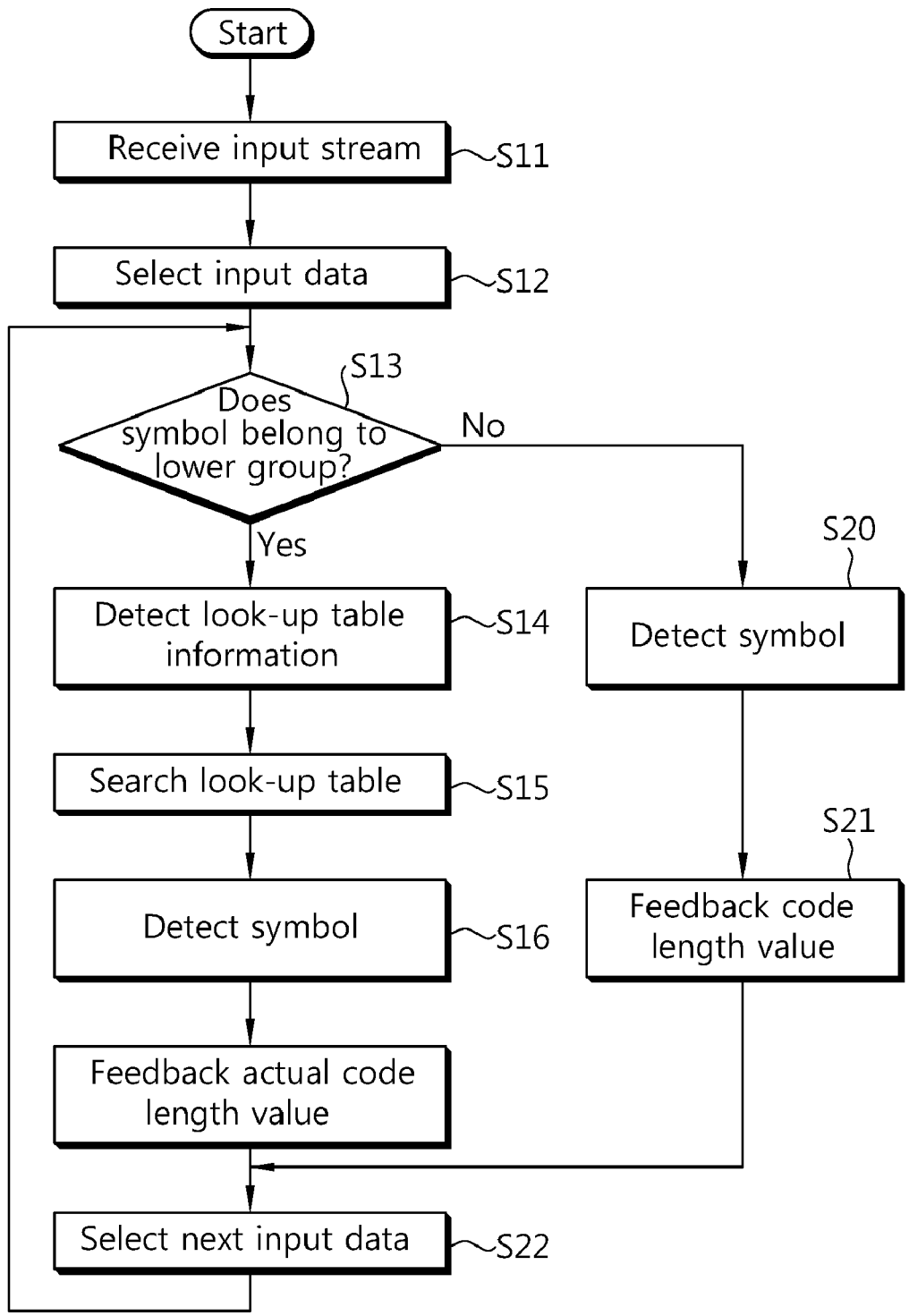
FIG. 9 is a flowchart illustrating a process of decoding an input stream using a variable length decoding apparatus.

After the above procedure is completed, the variable length decoding apparatus 10 can receive an input stream and perform decoding. FIG. 9 is a flowchart illustrating a process of decoding an input stream using the variable length decoding apparatus 10.

As shown in FIG. 9, first, the variable length decoding apparatus 10 receives an input stream (step: S11) and selects the input data of M bits from the received input stream (step: S12).

The variable length decoding apparatus 10 determines whether a symbol corresponding to the selected input data is included in an upper group or a lower group of a variable length code tree (step: S13). If, as a result of the determination, the symbol is determined to be included in the lower group, the variable length decoding apparatus 10 can detect the look-up table information corresponding to a subgroup including the symbol (step: S14). The look-up table information can include information (e.g., a look-up table ID and a look-up table address value) on which a corresponding look-up table can be found.

The variable length decoding apparatus 10 can search a look-up table stored in the memory unit based on the look-up table information (step: S15) and detects the symbol (step: S16). The variable length decoding apparatus 10 feeds back an actual code length value corresponding to the detected symbol (step: S17) and selects next input data (step: S22).

If, as a result of the determination, the symbol is determined to be included in the upper group, the variable length decoding apparatus 10 can detect the corresponding symbol (step: S20) and feed back a code length value corresponding to the detected symbol (step: S21). The variable length decoding apparatus 10 selects next input data using the code length value (step: S22).

Next, the variable length decoding apparatus 10 can decode an input stream by repeatedly performing the above procedures (i.e., steps S13 to S22) until the input stream is decoded.

Hereinafter, the above decoding procedure is described in more detail below.

FIGS. 10 to 13 are diagrams illustrating a process of the variable length decoding apparatus 10 decoding an input stream '010110011110'.

In the examples shown in FIGS. 10 to 13, the variable length decoding apparatus 10 can be the same as that shown in FIGS. 2 and 7. In addition, the split of a variable length code tree and a group used in variable length decoding can be the same as those shown in FIG. 5.

In other words, a variable length code tree can be split into an upper group, including a symbol 'a' and a symbol 'b', and a lower group, including a symbol 'c', a symbol 'd', a symbol 'e', a symbol 'f', and a symbol 'g'. Furthermore, the lower group can be split into a first subgroup C1, including a symbol 'c' and a symbol 'e', and a second subgroup C2, including a symbol 'd', a symbol 'f', and a symbol 'g'. Additionally, look-up tables corresponding to the first subgroup C1 and the second subgroup C2 can be stored in the memory unit. The shifter unit can select input data from the input stream in a unit of 5 bits (e.g., M is 5).

Figure 10:
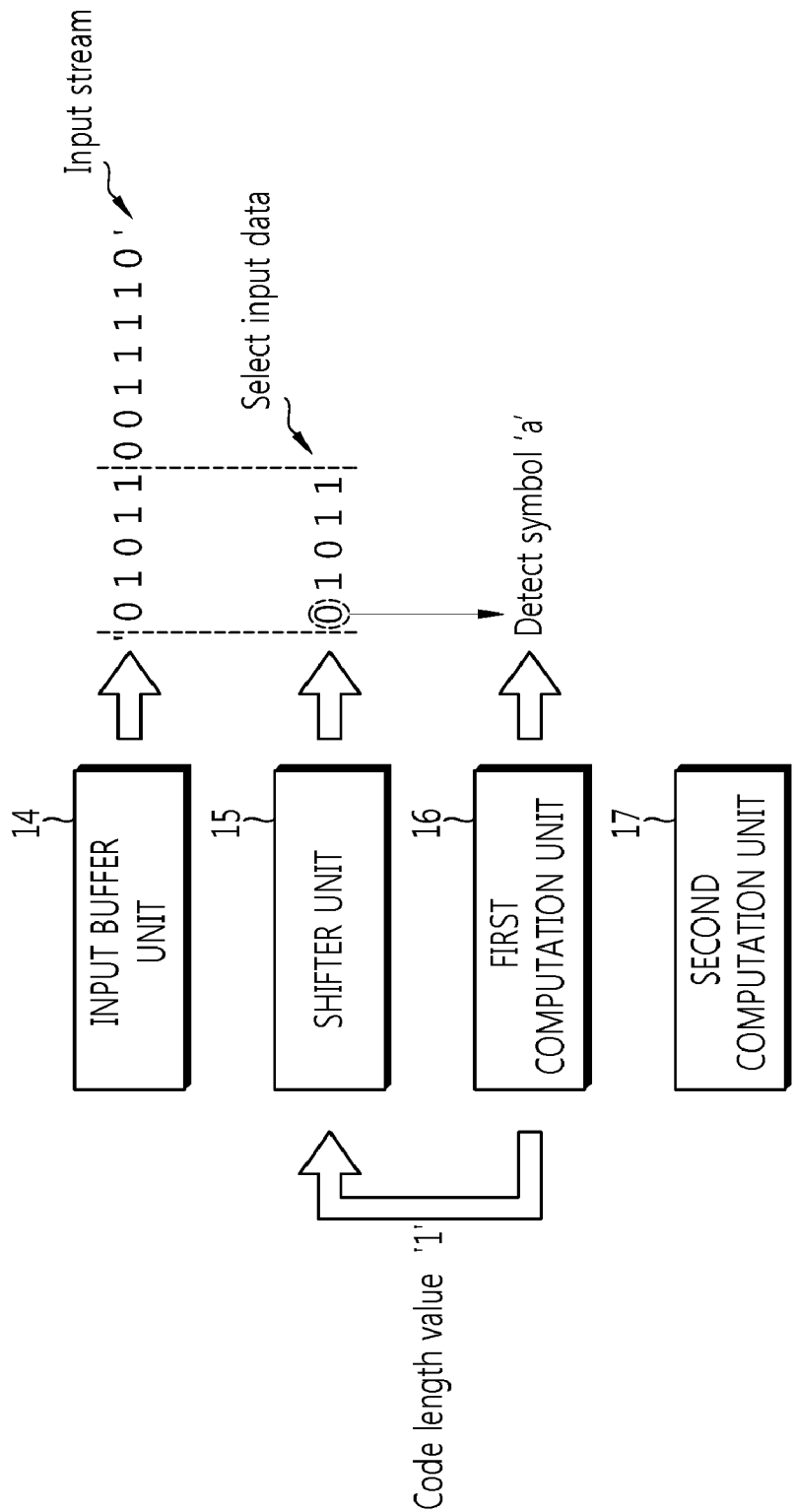
FIGS. 10, 11, 12 and 13 are diagrams illustrating a process of decoding an example input stream '0101 10011110' using a variable length decoding apparatus.

Referring first to FIG. 10, the input buffer unit 14 of the variable length decoding apparatus 10 stores an input stream '010110011110'. The shifter unit 15 selects first 5 bits '01011' from the input stream stored in the input buffer unit 14.

The first computation unit 16 compares the selected input data '01011' and a specific code using multiple comparison logics 62 to 68 in parallel. Here, the first comparison logic 62 of the first computation unit 16 can directly detect the symbol 'a', included in the upper group, based on the most significant bit '0' of the input data. Accordingly, the symbol 'a' (e.g., the first symbol) corresponding to the input stream can be detected within one operation cycle of the first computation unit 16. Meanwhile, the first computation unit 16 sends a code length value '1', corresponding to the detected symbol 'a', to the shifter unit 15.

Figure 11:
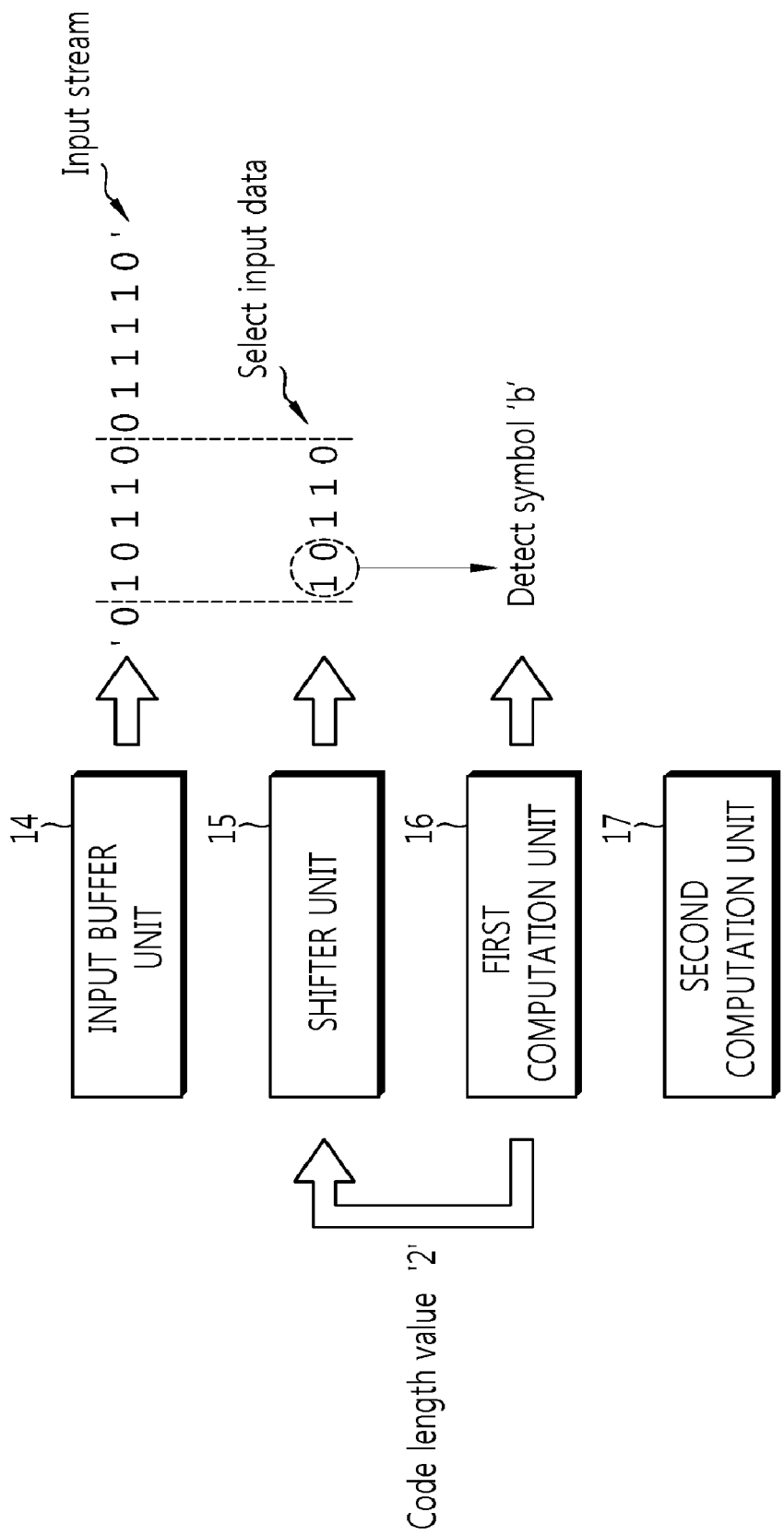

Referring to FIG. 11, because the code length value received from the first computation unit 16 is '1', the shifter unit 15 can be moved by 1 bit from the first bit of the previously selected input data and select the input data '10110' of 5 bits. The first computation unit 16 compares the selected input data '10110' and a specific code using the multiple comparison logics 62 to 68 in parallel. Here, the second comparison logic 64 of the first computation unit 16 can detect the symbol 'b', included in the upper group, based on the information that the upper two bits of the input data are '10.' Accordingly, the symbol 'b' (e.g., a second symbol) corresponding to the input stream can be detected within one operation cycle of the first computation unit. Meanwhile, the first computation unit 16 sends a code length value '2', corresponding to the detected symbol 'b', to the shifter unit 15.

Figure 12:
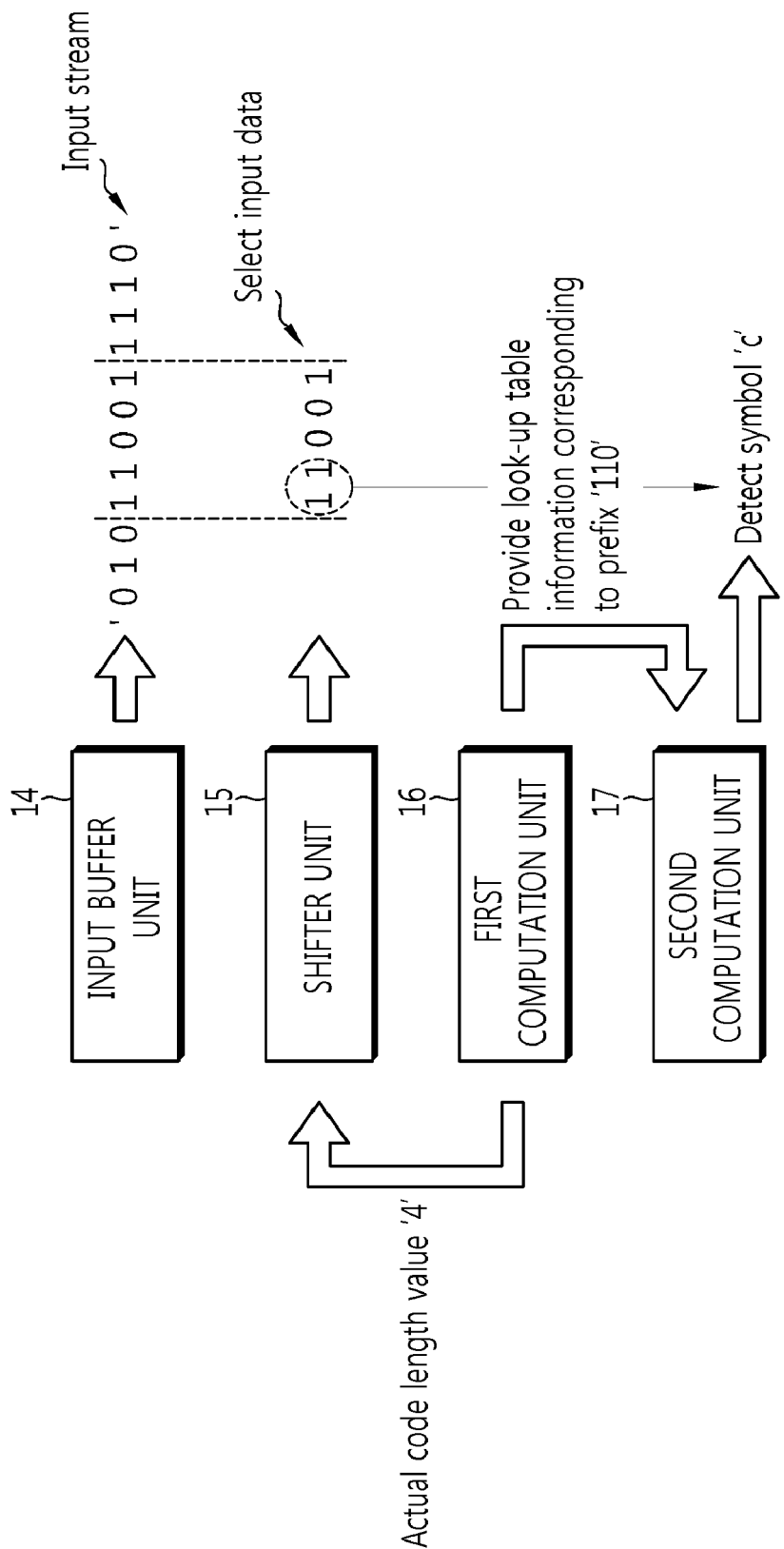

Referring to FIG. 12, because the code length value received from the first computation unit 16 is '2', the shifter unit 15 can be moved by two bits from the first bit of the previously selected input data and select the input data '11001' of 5 bits.

The first computation unit 16 compares the selected input data '11001' and a specific code using the multiple comparison logics 62 to 68 in parallel. Here, the third comparison logic 66 of the first computation unit 16 can output the look-up table information corresponding to the first subgroup C1, including a symbol, based on information that the upper three bits of the input data are '110.' Here, the look-up table information can include a look-up table ID, a look-up table address value, etc. on which a look-up table corresponding to the first subgroup C1 can be found.

The second computation unit 17 can search a look-up table corresponding to the first subgroup C1 based on the look-up table information outputted from the first computation unit 16 and detect a symbol 'c' corresponding to '01' (e.g., a code within a group of the first subgroup C1). Accordingly, the symbol 'c' (e.g., a third symbol) corresponding to the input stream can be detected within one operation cycle of the first computation unit 16 and one operation cycle of the second computation unit.

The second computation unit 17 can send an actual code length value '4', corresponding to the detected symbol 'c', to the shifter unit 15. As described above, a code value '10' within a group of the first subgroup C1 corresponds to a virtual node 57. Thus, if a prefix '110' (e.g., an address value) and the code value '10' within the group are added, the code length value is 5. However, 1 is subtracted from the code length value 5 with consideration taken of the virtual node, and so the actual code length value is 4.

Figure 13:
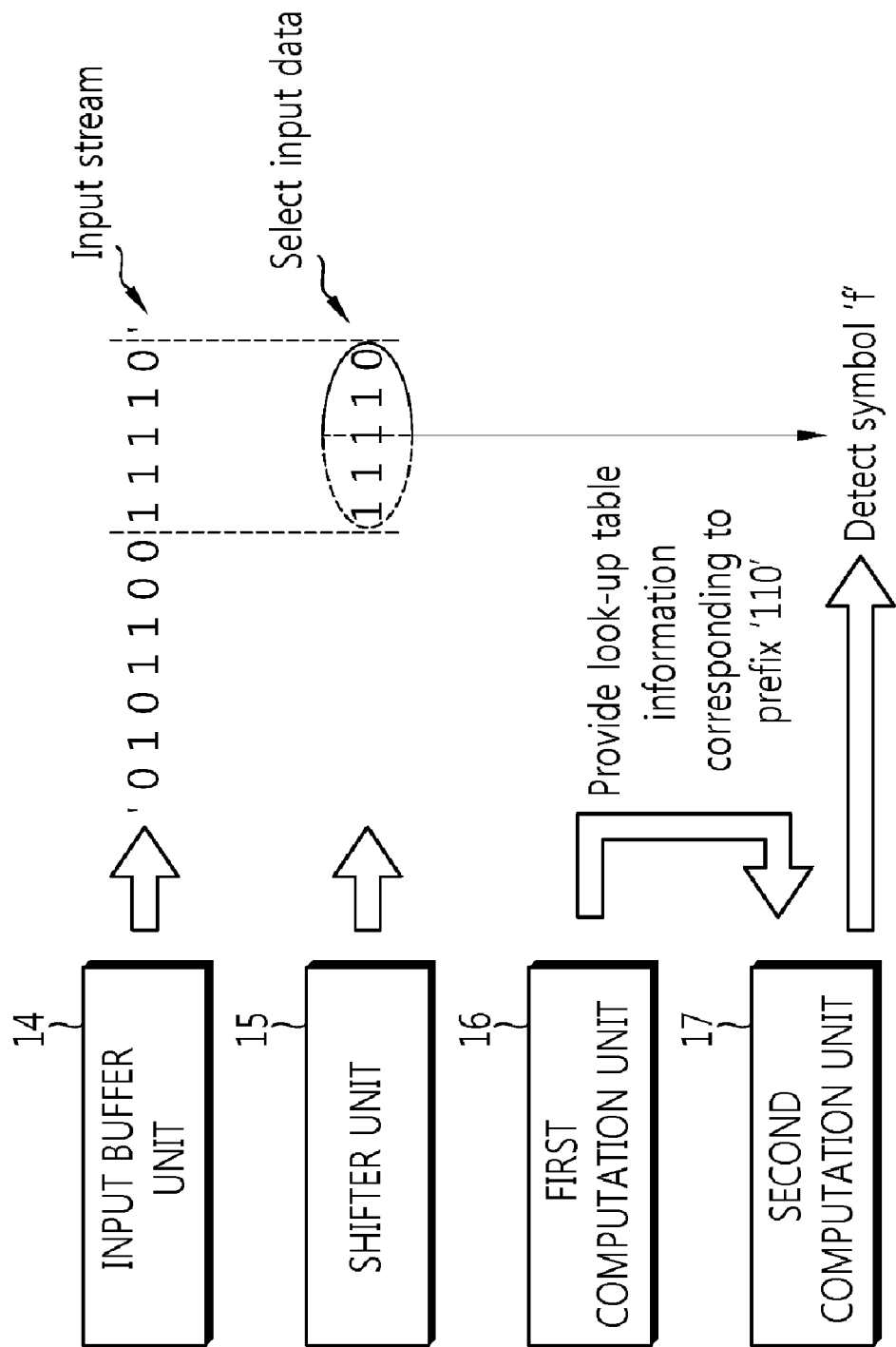

Referring to FIG. 13, because the code length value received from the second computation unit 17 is '4', the shifter unit 15 is moved by four bits from the first bit of the previously selected input data and selects input data '11110' of 5 bits. The first computation unit 16 compares the selected input data '11110' and a specific code using the multiple comparison logics 62 to 68 in parallel. Here, the fourth comparison logic 68 of the first computation unit 16 can output the look-up table information corresponding to the second subgroup C2 including a symbol based on the information that the upper three bits of the input data are '111' Here, the look-up table information can include a look-up table ID, a look-up table address value, etc. on which a look-up table corresponding to the second subgroup C2 can be found.

The second computation unit 17 can search a look-up table corresponding to the second subgroup C2 based on the look-up table information received from the first computation unit 16 and detect a symbol 'f' corresponding to '10' (e.g., a code within a group of the second subgroup C2). Accordingly, the symbol 'f' (e.g., the last symbol) corresponding to the input stream can be detected within one operation cycle of the first computation unit 16 and one operation cycle of the second computation unit 17.

As described above, the variable length decoding apparatus 10 can detect the symbols 'a, b, c, and f' by processing the input stream '010110011110'. Accordingly, decoding for the input stream can be completed.

When implementing the variable length decoding apparatus 10, not only rapidness of data processing, but also a reduction in the cost for a circuit region needed for calculation and a memory area needed for storing look-up tables may be required. It may depend on according to which form the variable length code tree is split.

The variable length code tree split unit 11 can split a variable length code tree such that a value, obtained by multiplying a total area cost, including the sum of an area cost for constructing computation units (e.g., the first computation unit 16 and the second computation unit 17) and an area cost for constructing memory (e.g., the memory unit 13), and a value (e.g., a square of a delay time for detecting a symbol) together, is minimized.

This can be expressed by the following equation 1.

$$B=AD^2 \qquad \text{[Equation 1]}$$

Here, A can refer to the total area cost. The total area cost is the sum of a circuit area cost and a memory area cost. D can refer to a delay time taken to perform calculation. D may also be referred to a critical path delay or a minimum clock period. B refers to total usefulness. A variable length code tree preferably is split in such a way as to minimize the total usefulness B.

To efficiently split the variable length code tree, the variable length code tree split unit 11 can use an empirical method or a quantum-inspired evolution algorithm (QEA) method. The empirical method can be used to calculate total usefulness B by splitting the variable length code tree in various ways and then inducing a split form that minimizes the total usefulness B. Furthermore, the QEA method is used to evolve the split form of a variable length code tree into an optimal form using a QEA algorithm.

To perform split using the empirical method or the QEA method, the variable length code tree split unit 11 may comprise a corresponding algorithm. The variable length code tree split unit 11 may receive split form information about a variable length code tree from the outside (e.g., other device, a communication network, or a user) and split the variable length code tree based on the received split form information.

Factors needed to calculate the B value of Equation 1 in order to efficiently implement the variable length decoding apparatus 10 are described below. For illustrative purposes, a delay time caused by the first computation unit 16 can be defined to be 'Ti', and a delay time caused by the second computation unit 17 can be defined to be 'Tii'. The delay time, Ti, can indicate the time that the first computation unit 16 takes to find a symbol or a look-up table ID and a look-up table address. The delay time, Tii, can indicate the time that the second computation unit 17 takes to search a look-up table. Accordingly, the delay time, Tii, can correspond to a memory access time.

The critical path delay (or minimum clock period) D of the variable length decoding apparatus 10 is a maximum of the delay time Ti and the delay time Tii. In the case where a symbol belongs to a lower group, during the delay time Ti, the first computation unit 16 compares input data and a specific code (e.g., a prefix (e.g., address value) of a subgroup). After the comparison is completed, the first computation unit 16 determines a look-up table including the symbol and generates a look-up table ID and a look-up table address value. In general, the time taken for such a process is greater than the time that the second computation unit 17 takes to search a look-up table. Accordingly, the critical path delay (or minimum clock period) D is in fact almost identical to the delay time Ti.

Provided that 'n1' represents the number of subgroups and 'n2' represents the prefix length of a subgroup having the greatest prefix length, from among the subgroups, the input data can be estimated to be roughly compare with the prefixes, each having the length of n2 bits, n1 times. In order to compare the input data and the n2-bit code, time $O(\log_2 n_2)$ is needed with consideration taken of a binary operation. The first computation unit 16 uses the multiple comparison logics in parallel. Accordingly, if n1 times of comparisons are performed in parallel, the time $O(\log_2 n_2)$ is needed in order to complete all comparison operations. However, the time needed to collect results in order to determine such a match is time $O(\log_2 n_1)$. With consideration taken of the above factors, a delay time, T1, can be modeled as expressed in the following equation 2.

$$T_1 = k_1 \log_2 n_2 + k_2 \log_2 n_2 + k_3 \quad \text{[Equation 3]}$$

In Equation 2, k1, k2, and k3 are constants. To demonstrate that the delay time, T1, expressed in Equation 2 is reasonable, the graph shown in FIG. 14 can be obtained by observing a correlation between the prefix length 'n2' and the critical path delay (or minimum clock period) D with the number of subgroups 'n1' being fixed.

Figure 14:
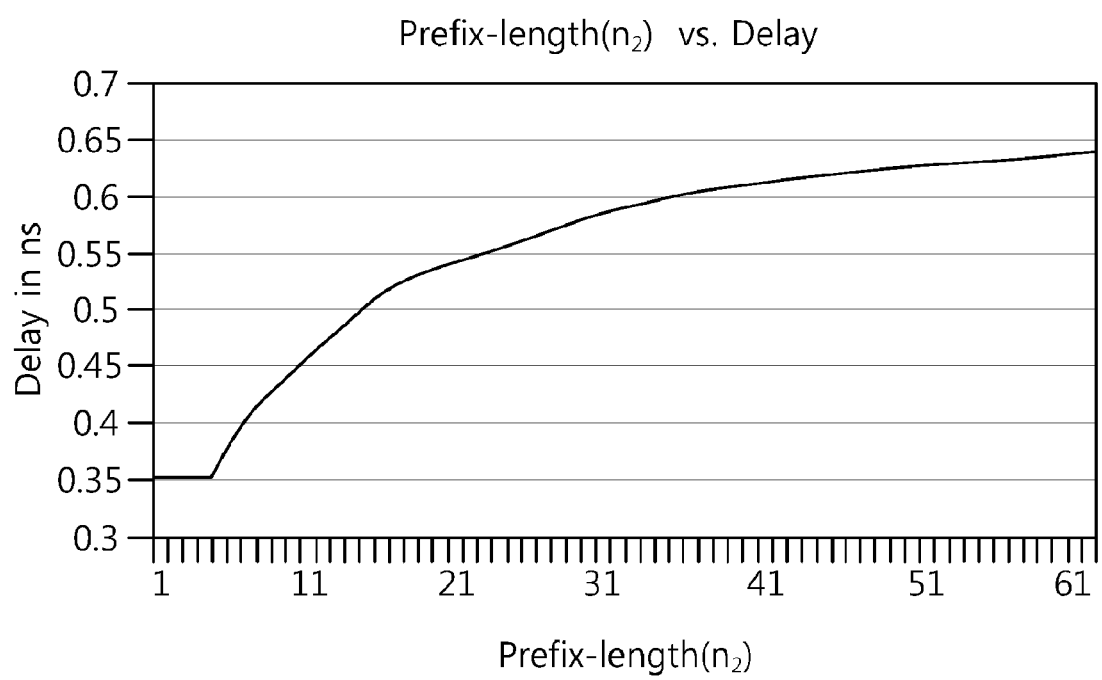
FIG. 14 is a graph showing a change in D according to an increase of a prefix length 'n2' when the number of subgroups 'n1' is fixed.

FIG. 14 is a graph showing a change in the critical path delay (or minimum clock period) D according to an increase of the prefix length 'n2' with the number of subgroups 'n1' fixed. As shown in FIG. 14, if the prefix length 'n2' is increased with the number of subgroups 'n1' fixed, the critical path delay (or minimum clock period) D is increased in a logarithmic function manner.

Figure 15:
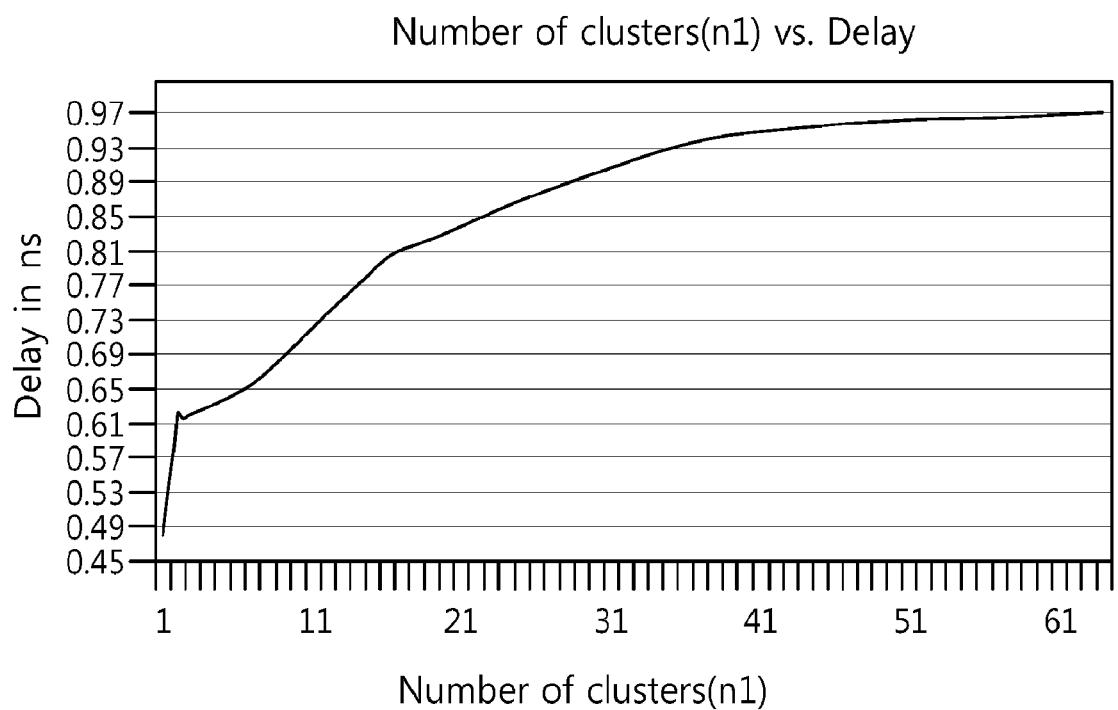
FIG. 15 is a graph showing a change in D according to an increase of the number of subgroups 'n1' when the prefix length 'n2' is fixed.

The graph shown in FIG. 15 can be obtained by observing a correlation between the number of subgroups n1 and the critical path delay (or minimum clock period) D with the prefix length 'n2' fixed. FIG. 15 is a graph showing a change in the critical path delay (or minimum clock period) D according to an increase of the number of subgroups 'n1' when the prefix length 'n2' is fixed.

As shown in FIG. 15, if the number of subgroups 'n1' is increased with the prefix length 'n2' fixed, the critical path delay (or minimum clock period) D is increased in a logarithmic function manner.

When experimentally calculating the constants k1, k2, and k3 through the graphs of FIGS. 14 and 15, the constants k1, k2, and k3 of Equation 2 roughly have respective values 0.14, 0.26, and 0.2. Accordingly, if the calculated values are substituted in Equation 2, the delay time T1 can be modeled as in the following equation 3.

$$T_1 = 0.14 \log_2 n_2 + 0.26 \log_2 n_1 + 0.2 \quad \text{[Equation 3]}$$

In Equation 3, the unit of the delay time T1 can be nanoseconds (ns).

The area cost A needed for the decoding operation of the variable length decoding apparatus 10 can be calculated by the sum of a circuit area cost and a memory area cost. It can be expressed by the following equation 4.

$$A = CA + MA \quad \text{[Equation 4]}$$

In Equation 4, CA can refer to the circuit area cost for constructing the first computation unit 16 and the second computation unit 17. MA can refer to the memory area cost for constructing the memory unit 13.

The circuit area cost CA can be modeled as in the following equation 5.

$$CA = k_4 n_2 + k_5 \log_2 n_1 + k_6 \quad \text{[Equation 5]}$$

In this case, k4, k5, and k6 are constant values. Furthermore, the unit of the circuit area cost CA is the number of gates.

The memory area cost MA can be a value in which a total number of bits are multiplied by an area for one bit. It can be expressed in the following equation 6.

$$MA = \sum_{i}^{ni} 2^{di} \times \text{data width} \times \text{area for one bit} \quad \text{[Equation 6]}$$

In Equation 6, 'i' indicates a subgroup index, and 'di' indicates the tree height of an $i^{th}$ subgroup. Furthermore, the unit of the memory area cost MA is the number of gates.

If the constants k4, k5, and k6 of Equation 5 are calculated from experimental results, the constants k4, k5, and k6 roughly have respective values 24, 51, and 614. An area for one bit memory space, including a core area, a user-defined power ring, and a pin spacing area, approximately requires two gates in single port static random access memory (SRAM). Furthermore, the data width of 13 bits are sufficient to store a symbol, a code length value, a control value, etc. for a decoding process.

Accordingly, if the calculated constant values are substituted in Equation 5, the data width value and the area value for one bit are substituted in Equation 6, and the two equations are then added, a value A can be modeled. The following equation 7 indicates an equation in which the value A is modeled.

$$A = 24n_2 + 51\log_2 n_1 + 26\sum_{i}^{ni} 2^{di} + 614 \quad \text{[Equation 7]}$$

When splitting a variable length code tree, the variable length code tree can be split in such a way as to minimize B based on the value A modeled by Equation 7 and the delay time Ti modeled by Equation 3.

As described above, according to the present invention, a variable length code tree is split into an upper group and a lower group, the lower group is split into multiple subgroups, and a look-up table corresponding to each subgroup is stored in the memory unit. Furthermore, when processing the input data, a symbol belonging to an upper group can be directly detected using a circuit or logic-based computation unit, and a symbol belonging to a lower group can be detected based on a search for a look-up table. Accordingly, there are advantages in that a variable length decoding apparatus can be efficiently constructed and decoding processing can be rapidly performed.

While this specification contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Only a few implementations and examples are described and other implementations, enhancements and variations can be made based on what is described and illustrated in this application.

What is claimed is:

1. A variable length decoding apparatus, comprising:
   a first computation unit to
      determine whether a symbol corresponding to an input data is included in an upper group or a lower group of a variable length code tree, and
      responsive to the determination, when the symbol corresponding to the input data is included in the lower group, detect look-up table information corresponding to a subgroup that includes the symbol corresponding to the input data within the lower group that includes a plurality of subgroups; and
   a second computation unit to detect the symbol corresponding to the input data by searching a look-up table corresponding to the look-up table information when the look-up table information is received from the first computation unit.

2. The variable length decoding apparatus of claim 1, wherein the first computation unit is operable to directly detect the symbol responsive to a determination that the symbol corresponding to the input data is included in the upper group.

3. The variable length decoding apparatus of claim 1, wherein the first computation unit comprises a plurality of comparison logics to compare at least one bit of the input data and a specific code; and
   when the at least one bit of the input data is identical to the specific code, outputting any one of the symbol and the look-up table information corresponding to the subgroup that includes the symbol.

4. The variable length decoding apparatus of claim 3, wherein the plurality of comparison logics are operable to operate in parallel.

5. The variable length decoding apparatus of claim 1, wherein the first computation unit comprises:
   a symbol comparison unit to compare at least one bit of the input data and a code value of a symbol included in the upper group; and
   a prefix comparison unit to compare the at least one bit of the input data and a prefix of a subgroup of the lower group.

6. The variable length decoding apparatus of claim 1, wherein the look-up table information comprises an ID of a lookup table corresponding to the subgroup, an address value on which the look-up table corresponding to the subgroup can be found or both the ID and the address value.

7. The variable length decoding apparatus of claim 1, wherein each of the plurality of subgroups comprises a tree in which a difference in a highest level between symbols of the tree is a specific value or less.

8. The variable length decoding apparatus of claim 1, further comprising:
   an input buffer unit to store an input stream; and
   a shifter unit to select the input data that comprises of M bits from the input stream stored in the input buffer unit, the M integer bits comprising at least one bit;
   wherein the first computation unit, the second computation unit or both the first computation unit and the second computation unit are operable to use the input data selected by the shifter unit.

9. The variable length decoding apparatus of claim 8, wherein:
   the first computation unit, the second computation unit or both the first computation unit and the second computation unit are operable to send an actual code length value corresponding to the detected symbol to the shifter unit; and
   the shifter unit is operable to select a next input data based on the received actual code length value.

10. The variable length decoding apparatus of claim 9, wherein the shifter unit is operable to
    shift by the actual code length value from a first bit of the previously selected input data to select the next input data; and
    select the input data of the M bits.

11. The variable length decoding apparatus of claim 1, further comprising a memory unit to store a plurality of look-up tables corresponding to the plurality of respective subgroups included in the lower group.

12. The variable length decoding apparatus of claim 1, wherein the look-up table comprises:
    a code value corresponding to a leaf node within the subgroup;
    a value of a symbol corresponding to the leaf node within the subgroup;
    a control value indicating whether a valid symbol exists in the leaf node within the subgroup; and
    an actual code length value corresponding to the symbol.

13. The variable length decoding apparatus of claim 12, wherein the second computation unit is operable to determine that the input data has an error when a control value of the detected symbol indicates that the symbol is invalid.

14. The variable length decoding apparatus of claim 1, further comprising:

a variable length code tree split unit operable to split the variable length code tree into the upper group and the lower group and split the lower group into the plurality of subgroups; and a look-up table storage unit to configure a plurality of look-up tables corresponding to the plurality of respective subgroups and store the plurality of configured look-up tables in a memory unit.

15. The variable length decoding apparatus of claim 14, wherein the variable length code tree split unit is operable to use any one of a quantum-inspired evolution algorithm (QEA) method and an empirical method in order to split the variable length code tree.

16. The variable length decoding apparatus of claim 15, wherein the variable length code tree split unit is operable to split the variable length code tree such that a value obtained by multiplying an area cost for constructing the first computation unit, the second computation unit and the memory unit, and a square of a delay time for detecting a symbol together is minimized.

17. The variable length decoding apparatus of claim 14, when each of the subgroups is not a perfect tree, the look-up table storage unit is operable to transform the subgroup into a perfect tree by adding at least one virtual node; and configure a look-up table corresponding to the transformed subgroup.

18. A variable length decoding apparatus, comprising:

a first computation unit to compare at least one bit of input data and a specific code, and detect a symbol corresponding to the input data or look-up table information corresponding to a subgroup that includes the symbol according to whether the symbol is included in an upper level or a lower level of a variable length code tree; and a second computation unit to detect the symbol by searching a look-up table corresponding to the look-up table information when the look-up table information is received from the first computation unit.

19. A variable length decoding method, comprising:

determining whether a symbol corresponding to an input data is included in an upper group or a lower group of a variable length code tree;

when the symbol is determined to be included in the lower group, detecting look-up table information corresponding to a subgroup including the symbol within the lower group; and detecting the symbol by searching a look-up table corresponding to the detected look-up table information.

20. The variable length decoding method of claim 19, further comprising, when the symbol is determined to be included in the upper group of the variable length code tree, detecting a symbol included in the upper group.

21. The variable length decoding method of claim 19, further comprising:

storing an input stream in a buffer; and selecting the input data of M bits from the input stream stored in the buffer, wherein M is an integer of 1 or more.

22. The variable length decoding method of claim 21, further comprising:

feeding back an actual code length value corresponding to the detected symbol; and selecting a next input data based on the feedback of the actual code length value.

23. The variable length decoding method of claim 19, wherein the look-up table comprises:

a code value corresponding to a leaf node within the subgroup;

a value of a symbol corresponding to the leaf node within the subgroup;

a control value indicating whether a valid symbol exists in the leaf node within the subgroup; and an actual code length value corresponding to the symbol.

24. The variable length decoding method of claim 23, further comprising determining that the input data has an error when a control value of the detected symbol indicates that the symbol is invalid.

25. The variable length decoding method of claim 19, further comprising:

splitting the variable length code tree into the upper group and the lower group;

splitting the lower group into a plurality of subgroups;

configuring a plurality of look-up tables corresponding to the plurality of respective subgroups; and storing the plurality of configured look-up tables in a memory unit.

26. The variable length decoding method of claim 25, further comprising detecting a tree split form in which a value obtained by multiplying an area cost for constructing computation units and the memory unit and a square of a delay time for detecting a symbol together is minimized.

27. The variable length decoding method of claim 19, wherein determining whether a symbol corresponding to an input data is included in an upper group or a lower group of a variable length code tree includes comparing at least one bit of the input data and a specific code by operating a plurality of comparison logics in parallel.

* * * * *